(12) United States Patent
Dunn et al.

(10) Patent No.: US 11,588,098 B2
(45) Date of Patent: Feb. 21, 2023

(54) METHOD OF MANUFACTURING A MULTI-LAYER PZT MICROACTUATOR USING WAFER-LEVEL PROCESSING

(71) Applicant: Magnecomp Corporation, Murrieta, CA (US)

(72) Inventors: Christopher Dunn, Austin, TX (US); Peter Hahn, Bangkok (TH)

(73) Assignee: Magnecomp Corporation, Murrieta, CA (US)

(*) Notice: Subject to any disclaimer, the term of this patent is extended or adjusted under 35 U.S.C. 154(b) by 874 days.

(21) Appl. No.: 16/186,408

(22) Filed: Nov. 9, 2018

(65) Prior Publication Data

US 2019/0081232 A1 Mar. 14, 2019

Related U.S. Application Data

(62) Division of application No. 14/745,417, filed on Jun. 20, 2015, now Pat. No. 10,128,431.

(51) Int. Cl.
*H01L 41/27* (2013.01)
*H01L 41/338* (2013.01)
(Continued)

(52) U.S. Cl.
CPC ............ *H01L 41/27* (2013.01); *H01L 41/053* (2013.01); *H01L 41/09* (2013.01); *H01L 41/23* (2013.01);
(Continued)

(58) Field of Classification Search
CPC ....... H01L 41/053; H01L 41/09; H01L 41/23; H01L 41/27; H01L 41/273; H01L 41/277;
(Continued)

(56) References Cited

U.S. PATENT DOCUMENTS 3,390,287 A 6/1968 Sonderegger
4,088,915 A 5/1978 Kodama
(Continued)

FOREIGN PATENT DOCUMENTS

CN 1504998 A 6/2004
CN 102449794 A 5/2012
(Continued)

OTHER PUBLICATIONS

D. R. Chen, M. G. Zhu, W. Z. Zhang and G. R. Li, "Preparation and characterization of PBNN multilayer piezoelectric actuator," 9th International Symposium on Electrets (ISE 9) Proceedings, 1996, pp. 1061-1066, doi: 10.1109/ISE.1996.578259. (Year: 1996).*

(Continued)

*Primary Examiner* — A. Dexter Tugbang
(74) *Attorney, Agent, or Firm* — DLA Piper LLP (US)

(57) ABSTRACT

A multi-level piezoelectric actuator is manufactured using wafer level processing. Two PZT wafers are formed and separately metallized for electrodes. The metallization on the second wafer is patterned, and holes that will become electrical vias are formed in the second wafer. The wafers are then stacked and sintered, then the devices are poled as a group and then singulated to form nearly complete individual PZT actuators. Conductive epoxy is added into the holes at the product placement step in order to both adhere the actuator within its environment and to complete the electrical via thus completing the device. Alternatively: the first wafer is metallized; then the second wafer having holes therethrough but no metallization is stacked and sintered to the first wafer; and patterned metallization is applied to the second wafer to both form electrodes and to complete the vias. The devices are then poled as a group, and singulated.

10 Claims, 11 Drawing Sheets

(51) Int. Cl.
*H01L 41/273* (2013.01)
*H01L 41/09* (2006.01)
*H01L 41/053* (2006.01)
*H01L 41/277* (2013.01)
*H01L 41/23* (2013.01)
*H03H 3/08* (2006.01)
*H01L 41/312* (2013.01)

(52) U.S. Cl.
CPC .......... *H01L 41/273* (2013.01); *H01L 41/277* (2013.01); *H01L 41/312* (2013.01); *H01L 41/338* (2013.01); *H03H 3/08* (2013.01); *Y10T 29/42* (2015.01)

(58) Field of Classification Search
CPC ....... H01L 41/312; H01L 41/338; H03H 3/08; Y10T 29/42
See application file for complete search history.

(56) References Cited

U.S. PATENT DOCUMENTS

| | | |
|---|---|---|
| 4,093,885 A | 6/1978 | Brown |
| 4,310,730 A | 1/1982 | Aaroe |
| 4,366,515 A | 12/1982 | Takano et al. |
| 4,443,729 A | 4/1984 | Rider |
| 4,633,122 A | 12/1986 | Radice |
| 4,769,570 A | 9/1988 | Yokoyama et al. |
| 5,376,860 A | 12/1994 | Sato |
| 5,402,159 A | 3/1995 | Takahashi et al. |
| 5,480,503 A | 1/1996 | Casey et al. |
| 5,485,053 A | 1/1996 | Baz |
| 5,632,841 A | 5/1997 | Hellbaum et al. |
| 5,712,758 A | 1/1998 | Amano et al. |
| 5,831,371 A | 11/1998 | Bishop |
| 5,849,125 A | 12/1998 | Clark |
| 5,861,702 A | 1/1999 | Bishop et al. |
| 5,883,651 A | 3/1999 | Thiel et al. |
| 6,060,811 A | 5/2000 | Fox et al. |
| 6,172,446 B1 | 1/2001 | Kanayama et al. |
| 6,245,172 B1 | 6/2001 | Face, Jr. |
| 6,278,587 B1 | 8/2001 | Mei |
| 6,326,718 B1 | 12/2001 | Boyd |
| 6,333,681 B1 | 12/2001 | Takeuchi et al. |
| 6,362,542 B1 | 3/2002 | Novotny |
| 6,421,211 B1 | 7/2002 | Hawwa et al. |
| 6,472,799 B2 | 10/2002 | Takeuchi et al. |
| 6,476,538 B2 | 11/2002 | Takeuchi et al. |
| 6,512,323 B2 | 1/2003 | Forck et al. |
| 6,538,854 B2 | 3/2003 | Koganezawa et al. |
| 6,605,887 B2 | 8/2003 | Takeuchi et al. |
| 6,614,144 B2 | 9/2003 | Vazquez Carazo |
| 6,618,220 B2 | 9/2003 | Inagaki et al. |
| 6,636,387 B2 | 10/2003 | Kikkawa et al. |
| 6,643,902 B2 | 11/2003 | Takeuchi et al. |
| 6,716,363 B1 | 4/2004 | Wright et al. |
| 6,726,984 B2 | 4/2004 | Natarajan et al. |
| 6,762,536 B2 | 7/2004 | Hoffmann et al. |
| 6,812,594 B2 | 11/2004 | Face et al. |
| 6,817,072 B2 | 11/2004 | Takeuchi et al. |
| 6,817,073 B2 | 11/2004 | Uchiyama et al. |
| 6,847,155 B2 | 1/2005 | Schwartz et al. |
| 7,085,092 B2 | 8/2006 | Koganezawa |
| 7,126,497 B2 | 10/2006 | Face et al. |
| 7,164,221 B1 | 1/2007 | Takeuchi et al. |
| 7,218,481 B1 | 5/2007 | Bennin et al. |
| 7,245,064 B2 | 7/2007 | Takeuchi et al. |
| 7,336,021 B2 | 2/2008 | Takeuchi et al. |
| 7,358,647 B2 | 4/2008 | Takeuchi et al. |
| 7,368,860 B2 | 5/2008 | Wood et al. |
| 7,382,583 B2 | 6/2008 | Hirano et al. |
| 7,440,236 B1 | 10/2008 | Bennin et al. |
| 7,459,835 B1 | 12/2008 | Mei et al. |
| 7,595,965 B1 | 9/2009 | Kulangara et al. |
| 7,652,412 B2 | 1/2010 | Nihei |
| 7,671,519 B2 | 3/2010 | Kear et al. |
| 7,692,559 B2 | 4/2010 | Face et al. |
| 7,746,279 B2 | 6/2010 | McGovern et al. |
| 7,781,679 B1 | 8/2010 | Schreiber et al. |
| 7,872,834 B1 | 1/2011 | Pokornowski et al. |
| 7,983,008 B2 | 7/2011 | Liao et al. |
| 8,004,159 B2 | 8/2011 | Nihei |
| 8,085,508 B2 | 12/2011 | Hatch |
| 8,148,791 B1 | 4/2012 | Holaway |
| 8,149,545 B1 | 4/2012 | Chai et al. |
| 8,189,296 B2 | 5/2012 | Hata et al. |
| 8,189,301 B2 | 5/2012 | Schreiber |
| 8,395,866 B1 | 3/2013 | Schreiber et al. |
| 8,570,688 B1 | 10/2013 | Hahn et al. |
| 8,680,749 B2 | 3/2014 | Xu et al. |
| 8,681,456 B1 | 3/2014 | Miller et al. |
| 8,699,186 B1 | 4/2014 | Hahn et al. |
| 8,773,820 B1 | 7/2014 | Hahn et al. |
| 8,780,503 B2 | 7/2014 | Wright et al. |
| 8,810,113 B2 | 8/2014 | Han et al. |
| 8,810,972 B1 | 8/2014 | Dunn |
| 8,879,210 B1 | 11/2014 | Hahn et al. |
| 9,070,394 B1 | 6/2015 | Hahn et al. |
| 9,117,468 B1 | 8/2015 | Zhang et al. |
| 9,318,136 B1 | 4/2016 | Bjorstrom et al. |
| 9,330,694 B1 | 5/2016 | Hahn et al. |
| 9,330,696 B1 | 5/2016 | Hahn et al. |
| 9,330,698 B1 | 5/2016 | Hahn et al. |
| 9,330,699 B1 | 5/2016 | Hahn et al. |
| 9,390,739 B1 | 7/2016 | Zhang et al. |
| 9,741,376 B1 | 8/2017 | Ee et al. |
| 10,074,390 B1 | 9/2018 | Hahn et al. |
| 10,128,431 B1 | 11/2018 | Dunn et al. |
| 10,236,022 B2 | 3/2019 | Ee et al. |
| 10,325,621 B1 | 6/2019 | Hahn et al. |
| 10,607,642 B2 | 3/2020 | Hahn et al. |
| 10,854,225 B2 | 12/2020 | Hahn et al. |
| 11,011,195 B2 | 5/2021 | Ee et al. |
| 11,205,449 B2 | 12/2021 | Glaess et al. |
| 11,276,426 B2 | 3/2022 | Hahn et al. |
| 2001/0050833 A1 | 12/2001 | Murphy et al. |
| 2002/0063496 A1 | 5/2002 | Forck et al. |
| 2002/0105750 A1 | 8/2002 | Li et al. |
| 2003/0137777 A1 | 7/2003 | Boutaghou et al. |
| 2004/0049900 A1* | 3/2004 | Emery .................... Y10T 29/42 29/25.35 |
| 2004/0095663 A1 | 5/2004 | Kuwajima et al. |
| 2004/0251784 A1* | 12/2004 | Kuniyasu .............. H01L 41/338 310/328 |
| 2007/0007863 A1 | 1/2007 | Mohr, III |
| 2007/0084034 A1 | 4/2007 | Omura et al. |
| 2007/0222339 A1 | 9/2007 | Lukacs et al. |
| 2009/0051245 A1 | 2/2009 | Takayama et al. |
| 2009/0080116 A1 | 3/2009 | Takahashi et al. |
| 2009/0096321 A1 | 4/2009 | Aikawa et al. |
| 2009/0195938 A1 | 8/2009 | Yao et al. |
| 2010/0195251 A1 | 8/2010 | Nojima et al. |
| 2010/0271735 A1 | 10/2010 | Schreiber |
| 2010/0276511 A1 | 11/2010 | Okamura |
| 2011/0279929 A1 | 11/2011 | Kin |
| 2012/0200198 A1 | 8/2012 | Amamoto |
| 2012/0216378 A1 | 8/2012 | Emley et al. |
| 2013/0320811 A1 | 12/2013 | Mizusawa et al. |
| 2014/0008101 A1 | 1/2014 | Brandts et al. |
| 2014/0104722 A1 | 4/2014 | Wright et al. |
| 2014/0111062 A1 | 4/2014 | Bauer et al. |
| 2016/0056366 A1 | 2/2016 | Nakamura |
| 2019/0214042 A1 | 7/2019 | Ee et al. |
| 2019/0228796 A1 | 7/2019 | Ee et al. |
| 2019/0237652 A1 | 8/2019 | Harada |
| 2020/0243745 A1 | 7/2020 | Ishizaki et al. |
| 2020/0251133 A1 | 8/2020 | Hahn et al. |
| 2020/0327904 A1 | 10/2020 | Glaess et al. |

(56) References Cited

U.S. PATENT DOCUMENTS

2021/0082459 A1  3/2021  Hahn et al.
2021/0272592 A1  9/2021  Ee et al.

FOREIGN PATENT DOCUMENTS

| | | |
|---|---|---|
| CN | 102741958 A | 10/2012 |
| CN | 103688318 A | 3/2014 |
| JP | 59-178899 A | 10/1984 |
| JP | 62104182 A * | 5/1987 ........... H01L 41/277 |
| JP | 6-232469 A | 8/1994 |
| JP | 2001-339967 A | 12/2001 |
| JP | 2009-65760 A | 3/2009 |
| JP | 2009-205723 A | 9/2009 |
| JP | 2010-103811 A | 5/2010 |
| JP | 2017-17241 A | 1/2017 |
| WO | WO 2006/073018 A1 | 7/2006 |
| WO | WO 2015/060132 A1 | 4/2015 |

OTHER PUBLICATIONS

Office Action in U.S. Appl. No. 16/357,181, dated Oct. 1, 2020.
Notice of Allowance in U.S. Appl. No. 16/835,243, dated Jul. 29, 2020.
Office Action in U.S. Appl. No. 16/857,133, dated Jul. 21, 2020.
International Search Report and Written Opinion in International Application No. PCT/US2021/028474, dated May 12, 2021.
Office Action in U.S. Appl. No. 16/857,133, dated Apr. 5, 2021.
Office Action in U.S. Appl. No. 17/107,729, dated Jul. 6, 2021.
Notice of Allowance in U.S. Appl. No. 16/857,133, dated Aug. 13, 2021.
Notice of Reasons for Refusal in Japanese Application No. 2017-149136, dated Aug. 3, 2021.
Notice of Allowance in U.S. Appl. No. 16/357,181, dated Jan. 22, 2021.
Office Action in U.S. Appl. No. 16/857,133, dated Dec. 28, 2020.
Aimmanee, Sontipee, Deformation and Force Characteristics of Laminated Piezoelectric Actuators, Dissertation at Virginia Polytechnic Institute and State University, 2004.
Batra, R.C. and Geng, T.S., Enhancement of the Dynamic Buckling Load for a Plate by Using Piezoceramic Actuators, Smart Materials and Structures (2001), vol. 10, pp. 925-933.
Capozzoli, M. et al., Modeling Aspects Concerning Thunder Actuators, Proceedings of the SPIE, Smart Structures and Materials 1999, vol. 3667, pp. 719-727.
Finio, Benjamin M. and Wood, Robert J., Optimal Energy Density Piezoelectric Twisting Actuators, 2011 IEEE/RJS International Conference on Intelligent Robots and Systems, Sep. 25-30, 2011, p. 384-389.
Luo, Quantian and Tong, Liyong, Exact Static Solutions to Piezoelectric Smart Beams Including Peel Stresses, International Journal of Solids and Structures (2002), vol. 39, pp. 4677-4695.
Kim, Sunghwan, Low Power Energy Harvesting with Piezoelectric Generators, PhD Thesis, 2002, University of Pittsburgh, esp. Fig, 27 (p. 51) and related discussion.
PI Ceramic GmbH (Germany), Displacement Modes of Piezoelectric Actuators, © 1996-2015, retrieved in 2015 from http://piceramic.com/piezo-technology/properties-piezo-actuators/displacement-modes.html, esp. p. 4 ff.
Phillips, James R., Piezoelectric Technology Primer, date unknown, CTS Wireless Components, Albuquerque, New Mexico, retrieved in 2015 from http://www.ctscorp.com/components/pzt/downloads/Piezoelectric_Technology.pdf, esp. pp. 8-11.
Smits, Jan G. and Dalke, Susan I., The Constituent Equations of Piezoelectric Bimorphs, IEEE 1989 Ultrasonics Symposium, pp. 781-784.
Notice of Allowance in U.S. Appl. No. 15/227,780, dated Apr. 14, 2017.
Office Action in Chinese Application No. 201710654540.5, dated May 27, 2020.
Office Action in U.S. Appl. No. 15/682,299, dated Sep. 25, 2017.
Office Action in U.S. Appl. No. 15/682,299, dated May 8, 2018.
Notice of Allowance in U.S. Appl. No. 15/682,299, dated Nov. 2, 2018.
Office Action in U.S. Appl. No. 14/566,666, dated May 27, 2015.
Office Action in U.S. Appl. No. 14/720,827, dated Oct. 2, 2015.
Office Action in U.S. Appl. No. 14/672,122, dated Jul. 16, 2015.
Office Action in U.S. Appl. No. 15/055,618, dated Jan. 3, 2017.
Office Action in U.S. Appl. No. 15/055,618, dated Oct. 3, 2017.
Office Action in U.S. Appl. No. 15/055,618, dated Apr. 19, 2018.
Notice of Allowance in U.S. Appl. No. 15/055,618, dated Jan. 31, 2019.
Supplemental Notice of Allowance in U.S. Appl. No. 15/055,618, dated Feb. 21, 2019.
Office Action in U.S. Appl. No. 15/055,633, dated Sep. 27, 2017.
Notice of Allowance in U.S. Appl. No. 15/055,633, dated May 3, 2018.
Corrected Notice of Allowance in U.S. Appl. No. 15/055,633, dated May 17, 2018.
Corrected Notice of Allowance in U.S. Appl. No. 15/055,633, dated Jun. 5, 2018.
Corrected Notice of Allowance in U.S. Appl. No. 15/055,633, dated Aug. 10, 2018.
Office Action in U.S. Appl. No. 16/443,690, dated Aug. 7, 2019.
Notice of Allowance in U.S. Appl. No. 16/443,690, dated Nov. 21, 2019.
Office Action in U.S. Appl. No. 14/745,417, dated Jun. 14, 2017.
Office Action in U.S. Appl. No. 14/745,417, dated Nov. 16, 2017.
Notice of Allowance in U.S. Appl. No. 14/745,417, dated Jul. 18, 2018.
Supplemental Notice of Allowance in U.S. Appl. No. 14/745,417, dated Aug. 6, 2018.
Office Action in U.S. Appl. No. 16/357,181, dated Apr. 30, 2020.
Corrected Notice of Allowance in U.S. Appl. No. 16/857,133, dated Aug. 25, 2021.
Notice of Allowance in U.S. Appl. No. 17/107,729, dated Nov. 3, 2021.

* cited by examiner

METHOD OF MANUFACTURING A MULTI-LAYER PZT MICROACTUATOR USING WAFER-LEVEL PROCESSING

CROSS-REFERENCE TO RELATED APPLICATIONS

This application is a divisional of U.S. patent application Ser. No. 14/745,417 filed on Jun. 20, 2015, which is hereby incorporated by reference in its entirety.

BACKGROUND OF THE INVENTION

1. Field of the Invention

This invention relates to the field of piezoelectric microactuators. More specifically, this invention relates to the field of a method of manufacturing a multi-level piezoelectric microactuator using wafer-level processing.

2. Description of Related Art

Piezoelectric microactuators, sometimes simply called PZTs for short, are useful in a variety of applications, including as microactuators mounted on disk drive suspensions in order to effectuate fine movements of the read/write transducer head which writes data to, and reads data from, the spinning magnetic disk or optical disk.

When the underside of a PZT is mounted by adhesive to a product in order to effect small movements of that product, counterintuitively, it actually increases the effective stroke length of the PZT to have a rigid, inactive layer having the proper characteristics and that acts as a constraining layer, bonded to the top of the PZT. The physics of that counterintuitive effect is described in various pending applications by the assignee of the present invention, including in the following U.S. patent applications: Ser. No. 14/214,525 filed Mar. 14, 2014; Ser. No. 14/566,666 filed Dec. 10, 2014; and Ser. No. 14/620,120 filed Feb. 11, 2015.

SUMMARY OF THE INVENTION

One way to achieve such a constraining layer on a PZT is to construct a multi-layer PZT having two or more total layers, with the bottom layer(s) being active PZT material and the top layer(s) being inactive PZT material. The PZT material can be made inactive by not poling it, and/or not providing complementary pairs of electrodes to create an electric field across the device in operation.

PZTs used on suspensions, particularly in some of the most recent suspension designs, are extremely small. When manufacturing PZT device, especially such small devices, it is extremely advantageous to be able to manufacture the devices as much as possible at the wafer level. The term "wafer level" as used herein means prior to the step in the manufacturing process at which multiple devices are singulated from a wafer of PZT material, which wafer is later cut in two dimensions in order to separate the wafer into multiple devices. For example, some processing steps might be performed on a 2 inch by 2 inch PZT wafer, i.e., at the wafer level, with the wafer later being cut in both the x- and y-dimensions and further to separate the wafer into tens or even hundreds of individual PZT devices, with additional processing steps then being performed on those hundreds of devices in order to complete the PZT microactuator products. Obviously, the more manufacturing steps that can be performed at the wafer level, and the fewer the steps that must be performed at the individual part level, the more efficient the manufacturing process is.

Various methods are disclosed herein by which a multi-layer PZT having one or more inactive constraining layers can be manufactured entirely or almost entirely at the wafer level of processing, with the wafer then being cut into individual devices. The resulting manufacturing method is thus more efficient than prior techniques which required various processing steps to be performed at the strip level (after a one-dimension cut into the wafer to separate it into strips of PZT material) or at the device level (after two-dimension cuts into the wafer to separate it into individual PZT devices).

According to a first manufacturing method, two wafers of PZT material are provided with alignment holes or other alignment means. A number of additional through-holes which will become electrical vias are formed in the second wafer. One through-hole/via is provided for each inchoate PZT actuator device location. A first metallization layer is formed on the first wafer, and a patterned second metallization layer is formed on the second wafer with the second metallization layer not extending all the way to the through-holes. The two wafers are then stacked and adhered together to form a wafer stack with the first metallization layer being sandwiched between the two layers, the through-holes through the second wafer providing access to the first metallization layer, and the second metallization layer being on what will be called the bottom surface of the wafer stack. The wafer stack may then be fired and poled, all at the wafer level. Because only the second PZT layer has an electrode pair on its top and bottom surfaces, only the second PZT layer is poled by the poling process.

The wafer stack is then diced in both the x- and y-dimensions in order to singulate the wafer into a number of individual PZT devices, with each device having a through-hole that reaches the sandwiched metallization layer. The sandwiched metallization layer defines a first electrode for the device. The second metallization layer defines a second electrode for the device on its bottom surface.

The device is then bonded into place on the product using two spots of conductive adhesive such as conductive epoxy. The first spot of conductive adhesive extends into the through-hole to the first and sandwiched electrode, and creates a physical and electrical bond from the first electrode to a first electrical contact pad on the product, usually a contact pad that supplies the PZT driving voltage. The second spot of conductive adhesive creates a physical and electrical bond from the second electrode on the bottom of the device to a contact pad of the product, usually a grounded part of the product. Applying a driving voltage to the device causes an electric field to be placed across the second and bottom PZT layer, thus causing it to expand or contract according to its piezoelectric properties. At the same time, no electric field is created across the first and top PZT layer, so the first PZT layer is piezoelectrically inactive. It thus acts as a constraining layer to resist expansion or contraction of the second PZT layer which is piezoelectrically active. As discussed above, the existence of the constraining layer actually increases the effective stroke length of the device.

In this first manufacturing method, therefore, the conductive epoxy used to bond the PZT microactuator to the disk drive suspension or other product completes the electrical via to the first electrode. The device acts like a multi-layer PZT device having an inactive restraining layer and a wrap-around electrode, with a via performing the function of a wrap-around electrode, and rendering the device easier to manufacture than a similar device that actually includes a wrap-around electrode.

A second manufacturing method is similar to the first method, except that only a first metallization layer is laid down prior to stacking, with the second and masked metallization layer being laid down after stacking, and the dicing cuts are made through the locations of the through-holes, with each through-hole become two semi-circular holes for each of two nominally identical devices.

According to a third manufacturing method, two wafers of PZT material are provided with alignment holes or other alignment means. A number of additional through-holes which will become electrical vias are formed in the second wafer. One through-hole/via is provided for each inchoate PZT device location. A first metallization layer is formed on the first wafer. The two wafers are now stacked and adhered together to form a wafer stacked with the first metallization layer being sandwiched between the two layers, the through-holes through the second wafer providing access to the first metallization layer. It is at this point that the third method departs from the first two methods. Masked metallization is now applied such as by sputtering to the underside of the second wafer such that metallization extends into the holes to form individual electrical vias to the first metallization layer, and such that a second layer of metallization extends over most of the bottom surface of the second wafer, with the first and second electrodes of the device being electrically isolated from each other but both of those electrodes being electrically accessible from the bottom surface of the device. The wafer stack may then be fired and poled, all at the wafer level. Because only the second PZT layer has an electrode pair on its top and bottom surfaces, only the second PZT layer is poled by the poling process.

The wafer stack is then diced in both the x- and y-dimensions in order to singulate the wafer into a number of individual PZT devices, with each device having a metallized electrical via extending to the sandwiched metallization layer. The sandwiched metallization layer defines a first electrode for the device. The second metallization layer defines a second electrode for the device on its bottom surface.

In this third manufacturing method, therefore, after the singulation step the PZT microactuator is a complete device including an electrical via to the sandwiched first electrode, such that the device already has its two electrodes electrically accessible from the flat underside of the device. No additional conductive epoxy is needed at assembly time to reach up into the through-hole and thus to electrically access the sandwiched electrode.

BRIEF DESCRIPTION OF THE DRAWINGS

FIG. 1 is a top plan view of a pair of wafers of piezoelectric material before they have been processed.

FIG. 2 is a top plan view of the wafers of FIG. 1 after alignment holes have been formed in both wafers, and through-holes have been formed in the second wafer.

FIG. 3 is a top plan view of the wafers of FIG. 2 after metallization has been applied to both wafers.

FIG. 4 is a top plan view of the wafers of FIG. 3 after they have been stacked, with the second wafer on top of the first wafer.

FIG. 5 is a sectional view of the wafer stack of FIG. 4 taken along section line 5-5.

FIG. 6 is a top plan view of the wafer stack of FIG. 4 after it has been cut in the x- and y-directions in order to singulate out the individual devices.

FIG. 7 is a sectional view of the wafer stack of FIG. 6 taken along section line 7-7.

FIG. 8 is a closeup view of one multi-layer piezoelectric actuator device of FIG. 7.

FIG. 9 is a side sectional view of a product environment in which the multi-layer piezoelectric actuator device of FIG. 8 is to be placed.

FIG. 10 is a side sectional view of the multi-layer piezoelectric actuator device of FIG. 8 placed into the product environment of FIG. 9.

FIG. 11 is a side sectional view of the multi-layer piezoelectric actuator device and its product environment of FIG. 10, with the conductive adhesive being now compressed.

FIG. 12 is a top elevation view of a pair of wafers of piezoelectric material after through-holes have been formed in the second wafer.

FIG. 13 is a top plan view of the wafers of FIG. 12 after metallization has been applied to the second wafer.

FIG. 14 is a top plan view of the wafers of FIG. 13 after they have been stacked, with the first wafer on top of the second wafer, and the metallization on the second wafer being shown in phantom.

FIG. 15 is a sectional view of the wafer stack of FIG. 14 taken along section line 15-15.

FIG. 16 is a top plan view of the wafer stack of FIG. 14 after patterned metallization has been applied to the first wafer.

FIG. 17 is a sectional view of the wafer stack of FIG. 16 taken along section line 17-17.

FIG. 18 is a top plan view of the wafer stack of FIG. 16 after it has been cut in the x- and y-directions in order to singulate out the individual devices.

FIG. 19 is an oblique view of one of the individual multi-layer piezoelectric devices of FIG. 18.

FIG. 20 is a side sectional view of the multi-layer piezoelectric actuator device of FIG. 19 adhered into its product environment.

FIG. 21 is a top plan view of a pair of wafers of piezoelectric material before they have been processed.

FIG. 22 is a top plan view of the wafers of FIG. 21 after alignment holes have been formed in both wafers, and through-holes have been formed in the second wafer.

FIG. 23 is a top plan view of the wafers of FIG. 22 after metallization has been applied to the first wafer.

FIG. 24 is a top plan view of the wafers of FIG. 23 after they have been stacked, with the second wafer on top of the first wafer, with the metallization pattern on the first wafer being shown in phantom.

FIG. 25 is a sectional view of the wafer stack of FIG. 24 taken along section line 25-25.

FIG. 26 is a top plan view of the wafer stack of FIG. 24 after a metallization pattern has been applied to the second wafer.

FIG. 27 is a sectional view of the wafer stack of FIG. 26 after it has been cut in the x- and y-directions in order to singulate out the individual devices.

FIG. 28 is a side sectional view of one of the devices shown in FIG. 27 taken along section line 28-28.

FIG. 29 is a side sectional view the multi-layer piezoelectric actuator device of FIG. 28 adhered into its product environment.

DETAILED DESCRIPTION OF THE PREFERRED EMBODIMENTS

A common piezoelectric material is lead zirconate titanate (PZT). In the discussion that follows, the piezoelectric material may be referred to simply as PZT for ease of discussion, it being recognized that the invention is not limited to PZT as the piezoelectric material.

FIGS. 1-11 are process drawings that illustrate manufacturing and product placement steps according to a first illustrative embodiment of the invention. These process steps can be summarized as:

a. Form through-holes in the second wafer.
b. Metalize the first wafer, and mask and metalize the second wafer.
c. Stack.
d. Sinter and pole
e. Singulate by cutting near the holes.
f. Allow the same conductive adhesive that bonds the device to its environment to complete the electrical via and thus to complete the device.

Figure 1:
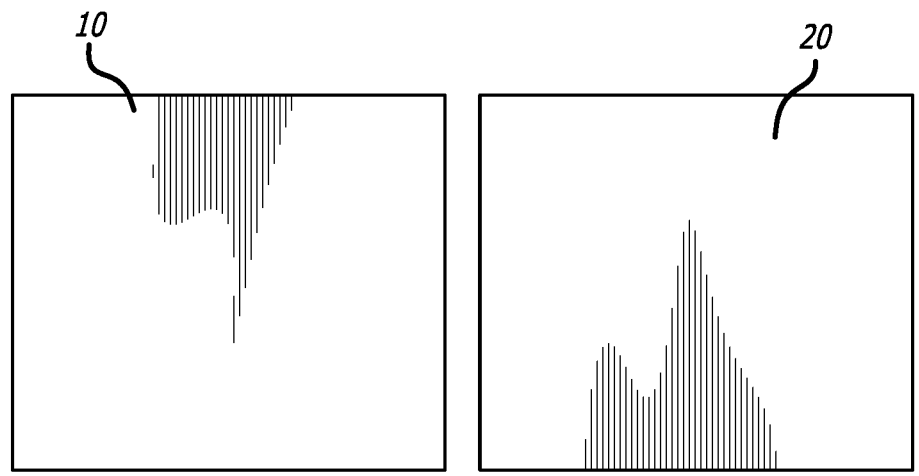
FIGS. 1-11 are process drawings that illustrate manufacturing and product placement steps according to a first illustrative embodiment of the invention.

FIG. 1 is a top plan view of a pair of wafers of piezoelectric material, namely first piezoelectric material wafer 10 and second piezoelectric material wafer 20, before they have been processed. The wafers would typically be "green," i.e. unsintered, PZT material.

Figure 2:
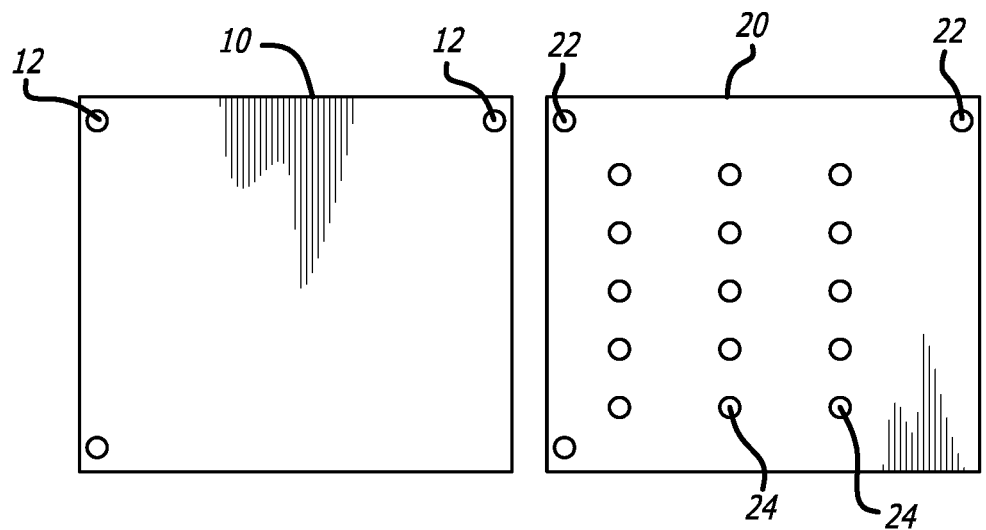

FIG. 2 is a top plan view of the PZT wafers of FIG. 1 after alignment means such as alignment holes 12 and 22 have been formed in both piezoelectric wafers 10 and 20, respectively, and through-holes 24 have been formed in the second wafer 20. Alignment holes 12 are not the only method of properly aligning the wafers; other alignment means, including other alignment indicia printed or formed on the wafers are possible. However, using holes 12, 22 as index holes or alignment holes is a simple and proven method for aligning parts during manufacturing, especially for small parts, allowing for fast and accurate alignment by automated pick-and-place production equipment. The through-holes 24 will become electrical vias later in the production process, and thus can be thought of as inchoate electrical vias.

Figure 3:
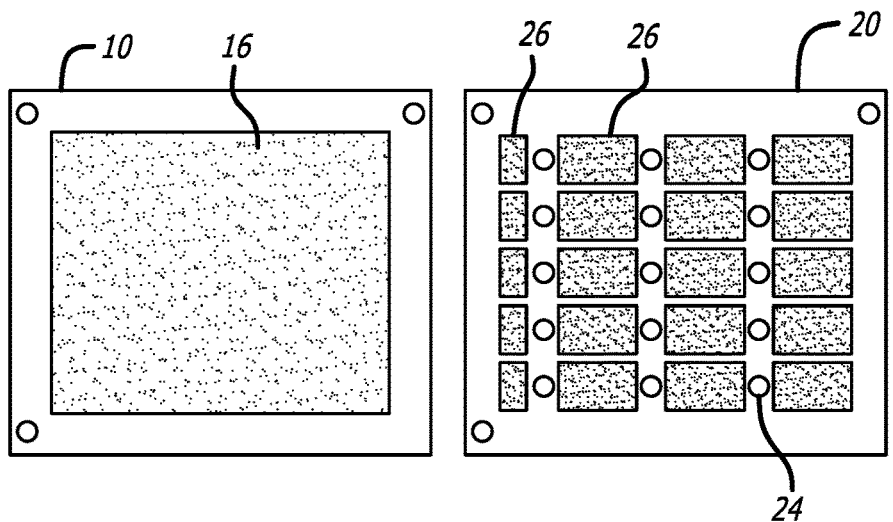

FIG. 3 is a top plan view of the wafers of FIG. 2 after a conductive layer 16 such as metallization has been applied to first wafer 10, and a patterned conductive layer 26 such as metallization has been applied to second wafer 20. The metallization or other conductive material 26 can be applied by sputtering, ink jet printing, or other well known metallization techniques. The first conductive layer 16 extends over all of the inchoate PZT actuator locations on first wafer 10. The second conductive layer 26 also extends over all of the inchoate PZT actuator locations on second wafer 20, although second conductive layer is masked into individual inchoate device electrodes. Second wafer 20 is masked before metallization so that the part of the metallization that will become bottom electrode 26 in FIG. 8 does not extend to through-holes 24.

Figure 8:
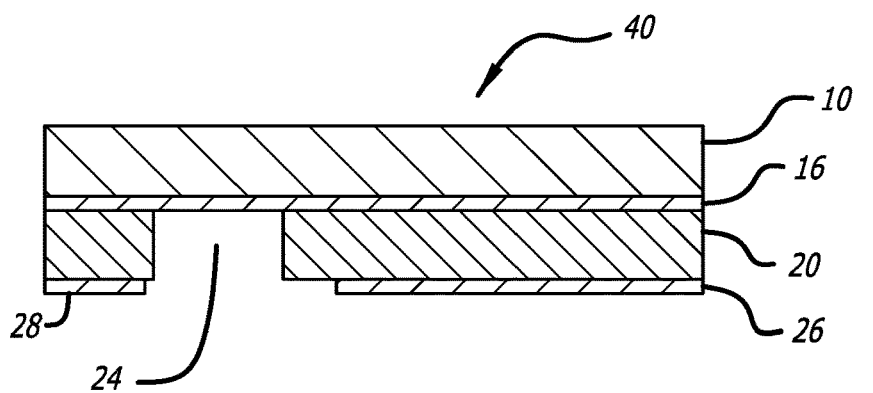

The first wafer 10 will become what will be called the first PZT layer of the finished device, and the conductive layer 16 on first layer 10 will become what will be called the first or top electrode of the device when it is finished (FIG. 8). Likewise, the second wafer 20 will become what will be called the second PZT layer of the device, and the conductive layer 26 on second layer 20 will become what will be called the second or bottom electrode of the device when it is finished.

Figure 4:
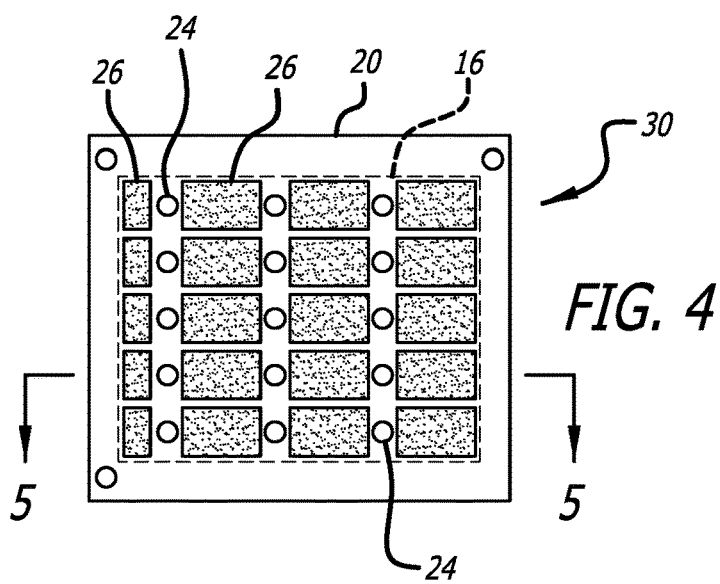

FIG. 4 is a top plan view of the wafers of FIG. 3 after they have been stacked with the second wafer placed on top of the first wafer such that the second conductive layer 26 is now on top of the wafer stack, to form PZT wafer stack 30.

Figure 5:
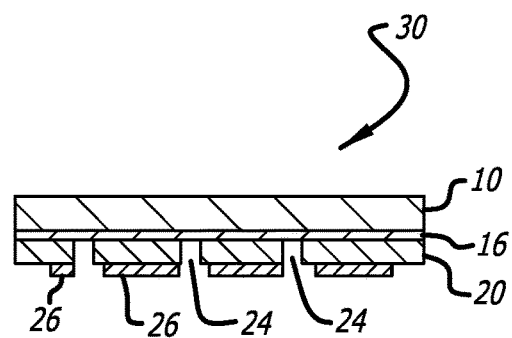

FIG. 5 is a sectional view of the wafer stack of FIG. 4 taken along section line 5-5.

At this point the wafer stack 30 would typically be sintered in order to harden and complete the "green" PZT material and to adhere the layers together.

After sintering the device can be poled at the wafer level by applying an appropriate poling voltage across the electrode layers 16 and 26. Various mechanical means of connecting poling voltages to the common first electrode layer 16 and to the individual second electrodes 26 can be used, including but not limited to using an array of weighted fingers similar to test bed fingers, to contact both second electrodes 26 and first electrode layer 16 through through-holes 24. Alternatively, first wafer 10 including associated first electrode layer 16 could be made slightly larger than second electrode 20 in one or more dimensions, in order to expose a surface of first electrode layer 16 beyond the edge of second wafer 20 for easy physical and electrical access to first electrode layer 16.

Figure 6:
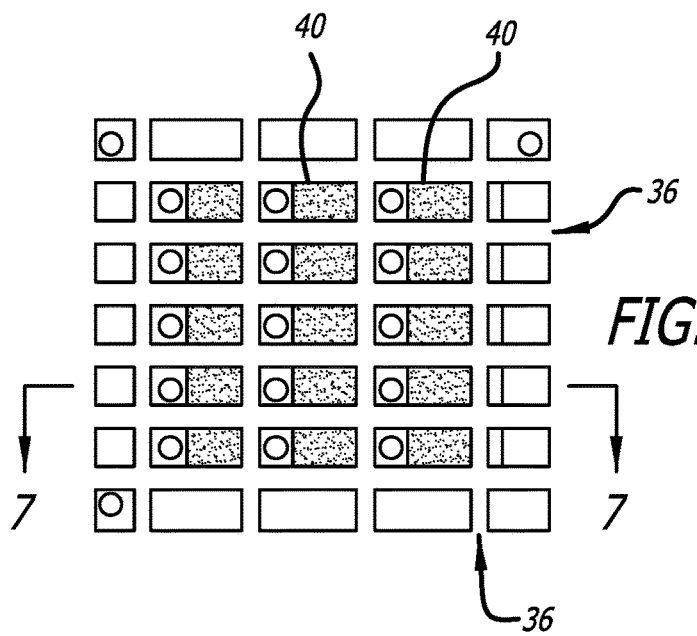

FIG. 6 is a top plan view of the wafer stack 30 of FIG. 4 after it has been cut or "diced" in orthogonal directions, i.e., the x- and y-directions, in order to singulate out individual devices 40. The wafer stack can be cut by mechanical sawing, by laser cutting, or by other known cutting methods.

Figure 7:
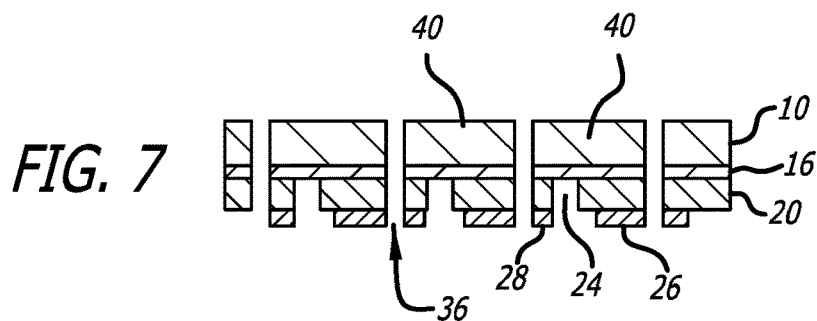

FIG. 7 is a sectional view of the wafer stack of FIG. 6 taken along section line 7-7.

FIG. 8 is a closeup view of one multi-layer piezoelectric actuator device 40 of FIG. 7. Multi-layer PZT actuator device 40 now includes a first PZT material layer 10 which will not be active, i.e. it will be substantially inactive, both because it has not been poled and because there is no associated pair of electrodes for placing a voltage across the device and hence creating an electric field across the device. Note that portion 28 of second conductive layer 26 will be made electrically common with first electrode 16 by conductive adhesive 72 in its environment (FIG. 11), and hence no electric field will be formed between portion 28 and first electrode 16. Second PZT material layer 20, on the other hand, will be active because there is an associated pair of electrodes 16 and 26 by which a voltage can be placed across the device and hence an electric field created across the device, and that PZT layer has been poled.

Figure 9:
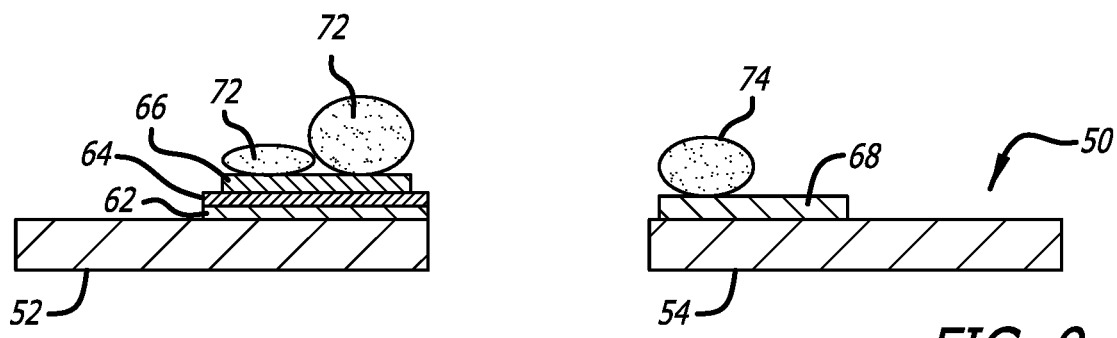

FIG. 9 is a side sectional view of a product environment in which the multi-layer piezoelectric actuator device of FIG. 8 is to be placed, including small drops of conductive adhesive 72 and 74 such as conductive epoxy. The product environment for a suspension would typically include grounded stainless steel substrate portions 52 and 54 of a flexure, or other grounded stainless steel suspension parts such as a base plate or load beam. A flexible electrical circuit includes an insulative layer 62 such as polyimide, and a copper contact pad 64 which is part of a signal conductive layer such as copper, copper/beryllium, or other copper alloy. Preferably, copper contact pad 64 has an anti-corrosive protective layer 66 such as gold on it, and stainless steel 54 also has an anti-corrosive protective layer 68 such as gold on it.

Figure 10:
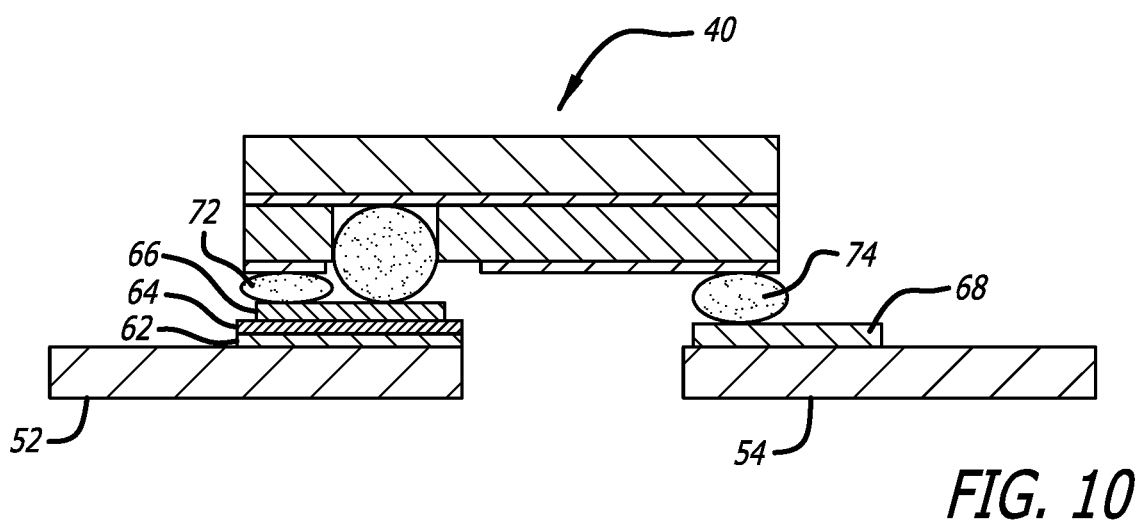

FIG. 10 is a side sectional view of the multi-layer piezoelectric actuator device 40 of FIG. 8 placed into the product environment of FIG. 9, before the PZT actuator 40 has been pressed down onto the conductive adhesive 72/74.

Figure 11:
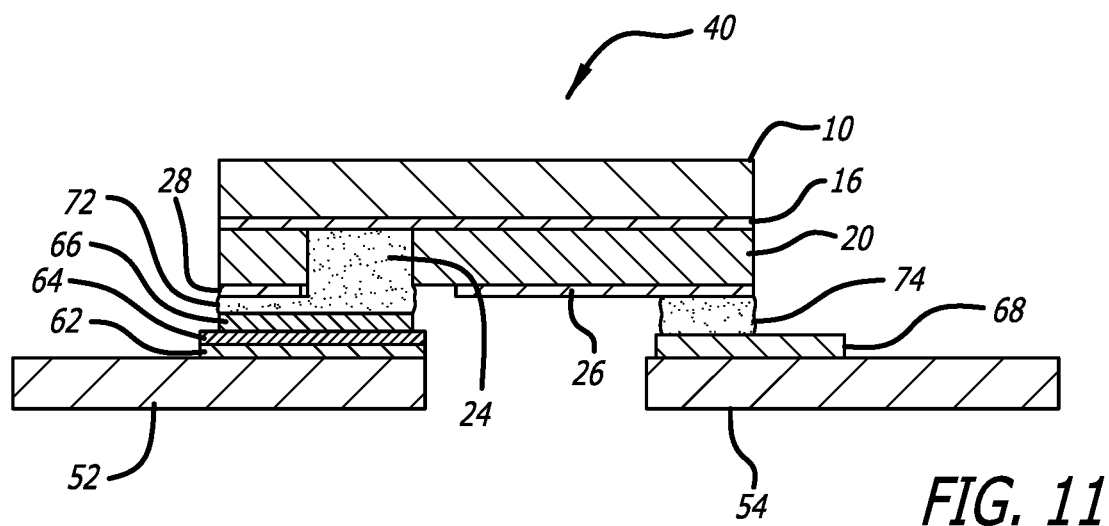

FIG. 11 is a side sectional view of the multi-layer piezoelectric actuator device 40 and its product environment of FIG. 10, with the device 40 now having been pressed down by sufficient pressure to compress and spread conductive adhesive 72/74 in order to ensure that the desired circuits are completed. Conductive adhesive 72, which now defines electrical via 24, carries the PZT actuation voltage from copper contact pad 64 to first electrode 16, and conductive adhesive 74 completes the ground path from second electrode 26 to grounded stainless steel body 54. When the PZT actuator device 40 is activated, parts 52 and 54 will be moved farther away from each other by expansion of the device, and will be moved closer together by contraction of the device.

Device 40 now acts as a multi-layer PZT device having an inactive restraining layer and a wrap-around electrode, with the via 24 performing the function of a wrap-around electrode but being simpler to manufacture than a wrap-around electrode.

FIGS. 12-20 are process drawings that illustrate manufacturing and product placement steps according to a second illustrative embodiment of the invention. These process steps can be summarized as:
 a. Form through-holes in the second wafer.
 b. Metalize the first face of the second wafer.
 c. Stack.
 d. Mask and metalize the second face of the second wafer.
 d. Sinter and pole.
 e. Singulate by cutting through the holes.
 f. Allow the same conductive adhesive that bonds the device to its environment to complete the electrical via and thus to complete the device.

Figure 12:
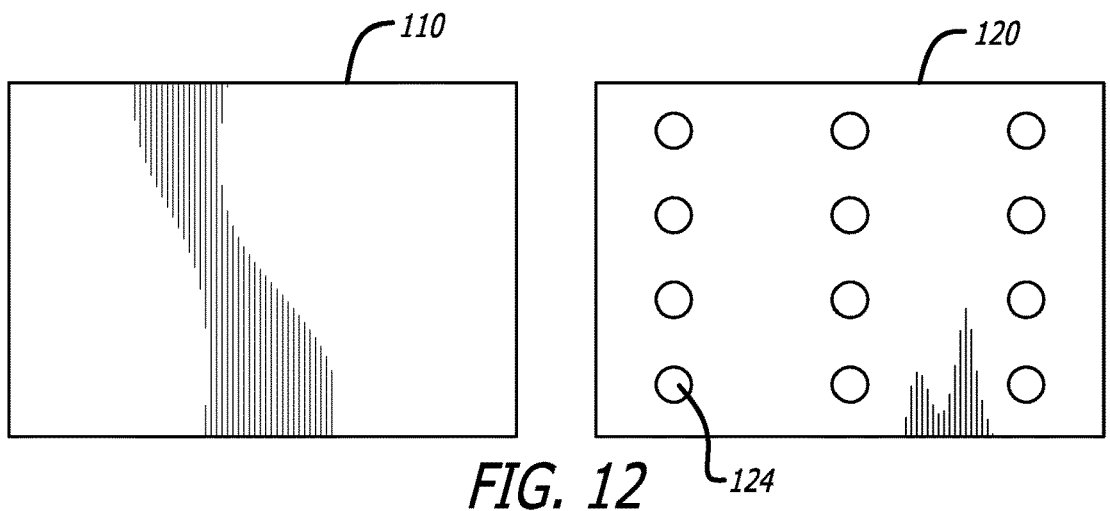
FIGS. 12-20 are process drawings that illustrate manufacturing and product placement steps according to a second illustrative embodiment of the invention.

FIG. 12 is a top elevation view of a pair of wafers of piezoelectric material, namely first PZT material wafer 110 and second PZT material wafer 120, after through-holes 124 have been formed in the second wafer. Through-holes 124 will eventually become electrical vias.

Figure 13:
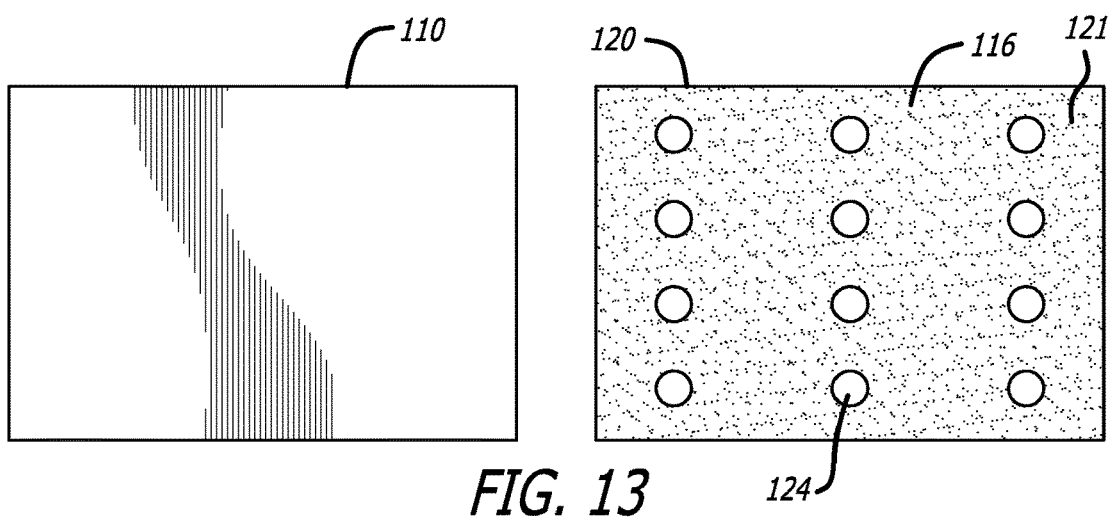

FIG. 13 is a top plan view of the wafers of FIG. 12 after what will be called a first conductive layer 116 such as metallization has been applied to a first or top side 121 of second wafer 120.

Figure 14:
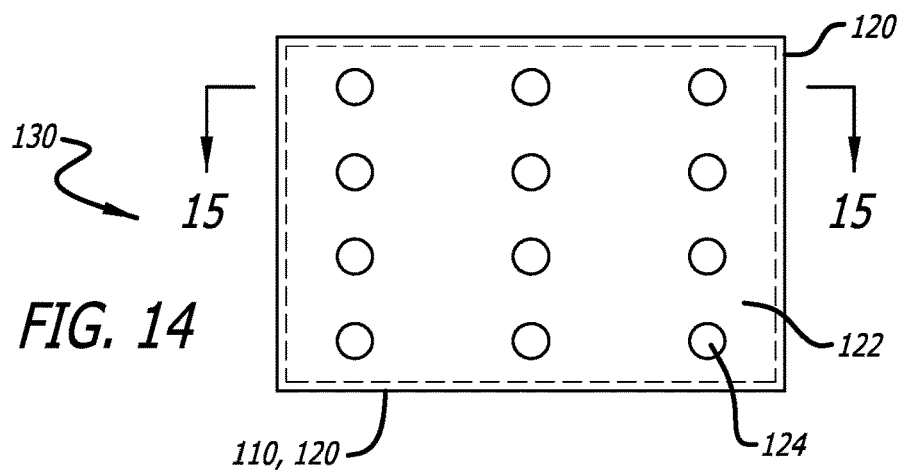

FIG. 14 is a top plan view of the wafers of FIG. 13 after they have been stacked to form wafer stack 130, with first wafer 110 stacked onto top side 121 of second wafer 120, now looking at wafer stack 130 from bottom side 122 of second wafer 120, the bottom side 122 being opposite top side 121. Conductive metallization layer 116 on top side 121 of second wafer 120 is shown in phantom.

Figure 15:
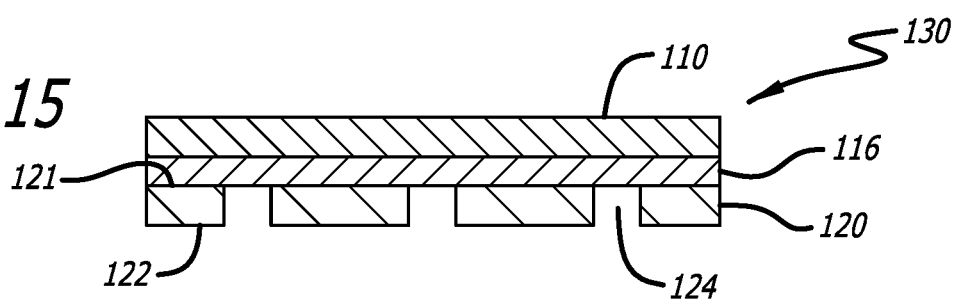

FIG. 15 is a sectional view of the wafer stack of FIG. 14 taken along section line 15-15.

Figure 16:
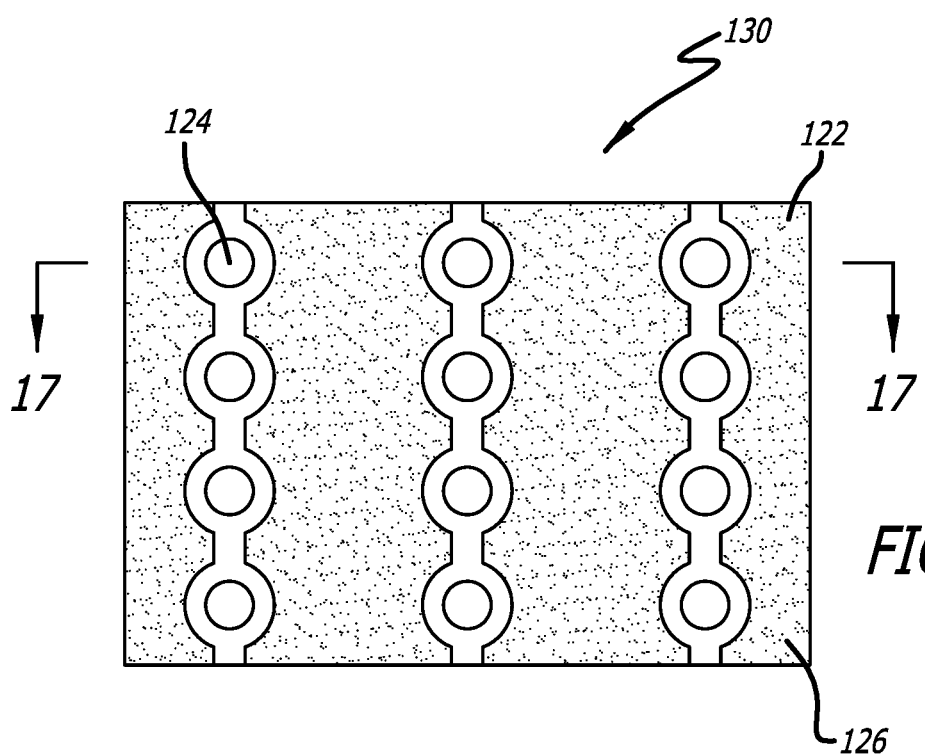

FIG. 16 is a top plan view of the wafer stack 130 of FIG. 14 after what will be called a second conductive layer 126, such as a patterned metallization layer, has been applied to second wafer 120. Second wafer 120 is masked before applying the layer 126 such that second conductive layer 126 does not extend to through-holes 124.

At this point the wafer stack 130 would typically be sintered in order to harden and complete the "green" PZT material and to adhere the layers together, and the stack would be poled, as discussed above with respect to FIG. 5.

Figure 17:
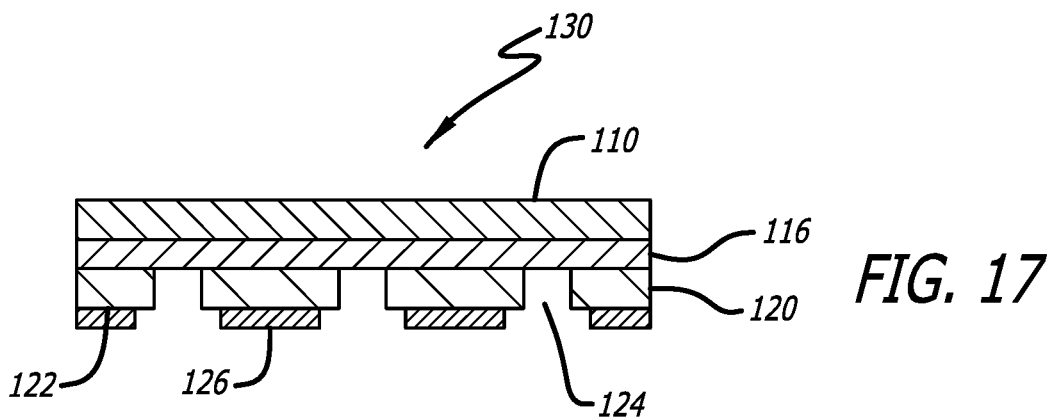

FIG. 17 is a sectional view of the wafer stack 130 of FIG. 16 taken along section line 17-17.

Figure 18:
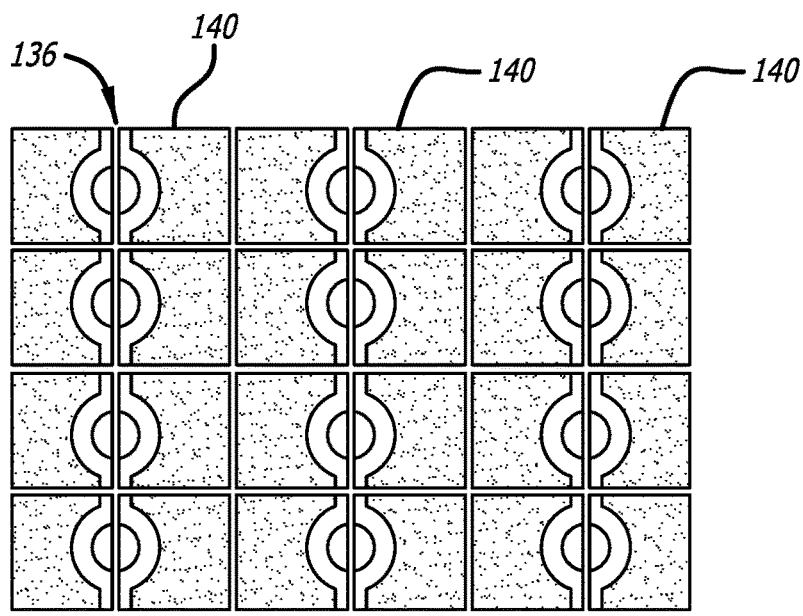

FIG. 18 is a top plan view of the wafer stack 130 of FIG. 16 after it has cut or "diced" in orthogonal directions, i.e., the x- and y-directions, in order to singulate out the individual devices 140. The wafer stack can be cut by mechanical sawing, by laser cutting or other known cutting methods. One difference between this second embodiment and the first embodiment is that in this second embodiment, wafer stack 130 is sawn through the locations of holes 124, rather than next to holes 24. After singulation through the holes, the holes become semi-circular holes 124 at the edges of the device 140.

Figure 19:
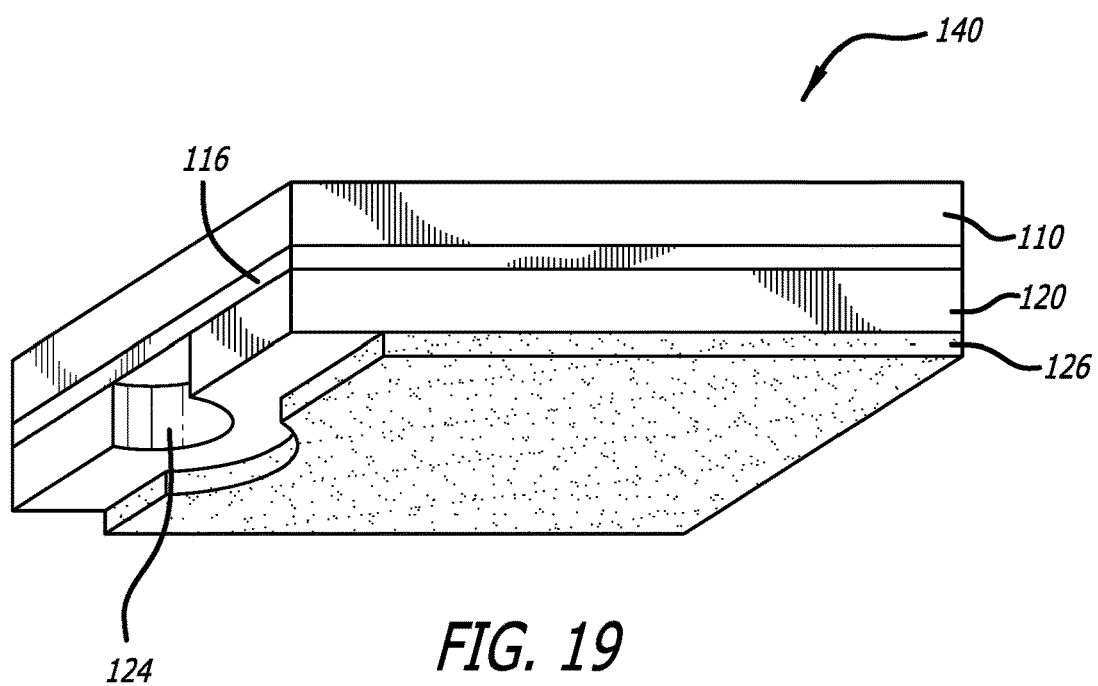

FIG. 19 is an oblique view of one of the individual multi-layer piezoelectric device 140 of FIG. 18, clearly showing semi-circular edge hole 124 which will become an electrical via, and bottom electrode 126 which does not reach semi-circular edge hole 124.

Figure 20:
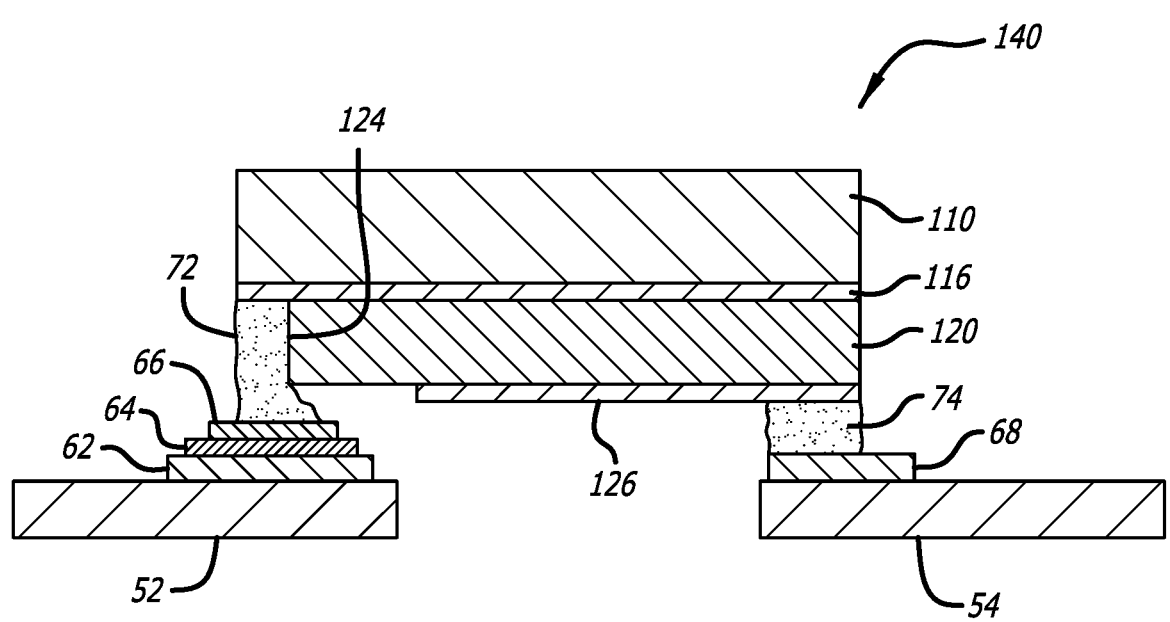

FIG. 20 is a side sectional view of the multi-layer piezoelectric actuator device 140 of FIG. 19 adhered into its product environment. The product environment including grounded product portions 52 and 54, the electrical circuit including insulating layer 62 such as polyimide, copper contact pad 66, and conductive adhesive such as conductive epoxy 72 and 74, are essentially the same as in the first illustrative embodiment shown in FIG. 11. Conductive epoxy 72 in semi-circular edge hole 126 completes the electrical via through the device to first electrode layer 116.

Device 140 now acts as a multi-layer PZT device having an inactive restraining layer and a wrap-around electrode, with the via 124 performing the function of a wrap-around electrode but being simpler to manufacture than a wrap-around electrode.

This embodiment may make it easier to make a quality electrical connection between copper contact pad 64 including its protective gold layer 66 to first electrode layer 116 because air will not be trapped in hole 24 which might make it more difficult to ensure a good spread of conductive epoxy 72 to the first conductive layer. In this embodiment, the spread of conductive epoxy 72 into semi-circular edge hole 124 and thus to first electrode layer 116 to ensure a good electrical contact thereto can be visually inspected and thus more easily verified.

FIGS. 21-29 are process drawings that illustrate the manufacturing and product placement steps according to a second illustrative embodiment of the invention. These process steps can be summarized as:
 a. Form through-holes in the second wafer.
 b. Metalize the first wafer.
 c. Stack.
 d. Mask and metalize the second wafer.
 d. Sinter and pole.
 e. Singulate by cutting near the holes.
 f. Sputter a metallization into and around the holes, to complete the device.
 f. Bond the device into its environment using conductive adhesive.

Figure 21:
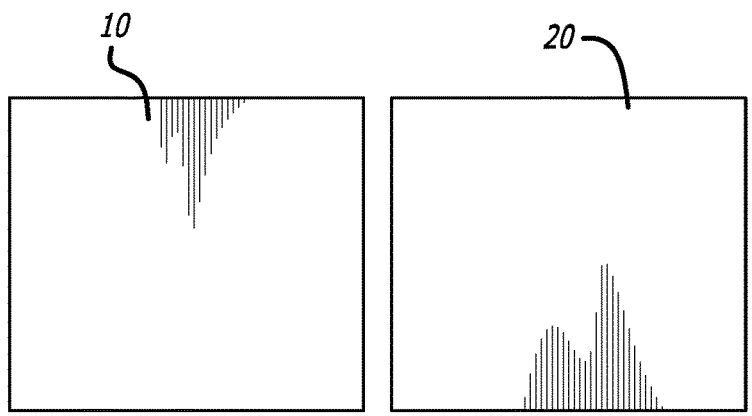
FIGS. 21-29 are process drawings that illustrate manufacturing and product placement steps according to a second illustrative embodiment of the invention.

FIG. 21 is a top plan view of a pair of wafers of piezoelectric material, namely first PZT wafer material 10 and second PZT wafer material 20, before they have been processed.

Figure 22:
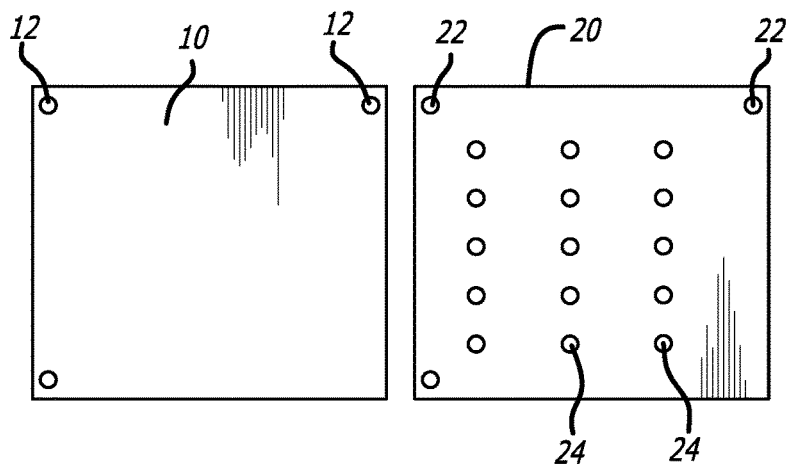

FIG. 22 is a top plan view of the wafers of FIG. 21 after alignment holes 12, 22 have been formed in first and second wafers 10 and 20, respectively, and through-holes 24 that will become vias have been formed in second wafer 20.

Figure 23:
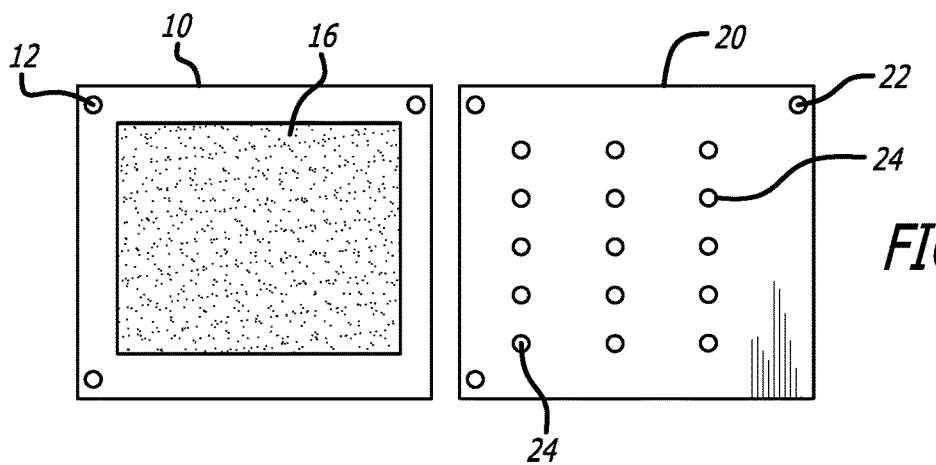

FIG. 23 is a top plan view of the wafers of FIG. 22 after a conductive layer 16 that defines a first electrode layer has been applied to the first wafer 10. The metallization or other conductive material 16 can be applied by sputtering, ink jet printing, or other well known metallization techniques.

Figure 24:
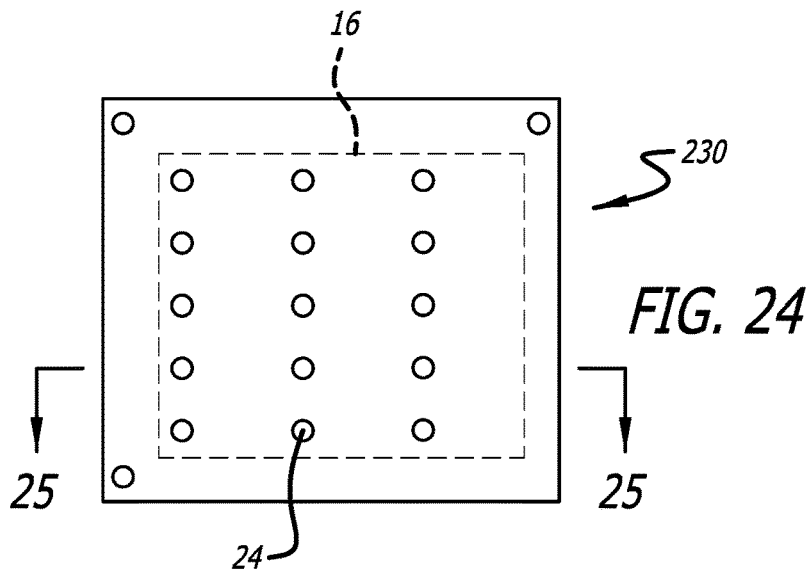

FIG. 24 is a top plan view of the wafers of FIG. 23 after they have been stacked with the second wafer on top of the first wafer to form wafer stack 230, and with the metallization pattern 16 on the first wafer 10 being shown in phantom.

Figure 25:
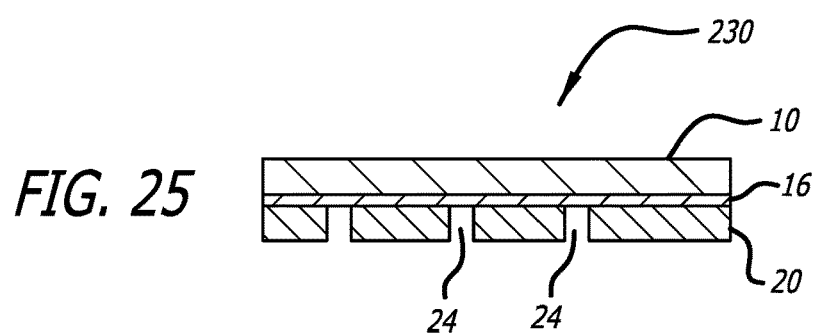

FIG. 25 is a sectional view of the wafer stack 230 of FIG. 24 taken along section line 25-25.

Figure 26:
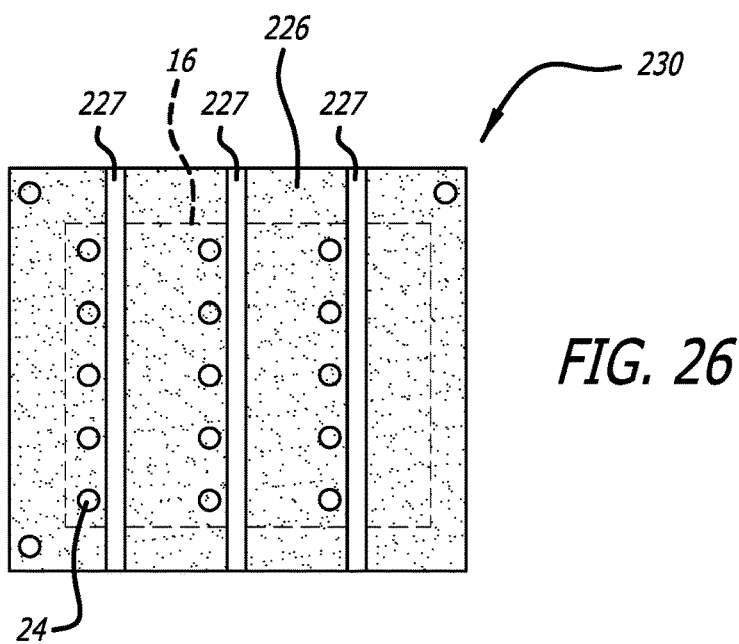

FIG. 26 is a top plan view of the wafer stack 230 of FIG. 24 after patterned conductive material 226, such as a metallization layer created by sputtering, has been applied to the second wafer 20. Areas without metallization created by masking define gaps 227 in conductive layer 226. The sputtered metal extends into holes 24 to first conductive layer 16, and around holes 24 on the surface of second wafer 20.

Figure 27:
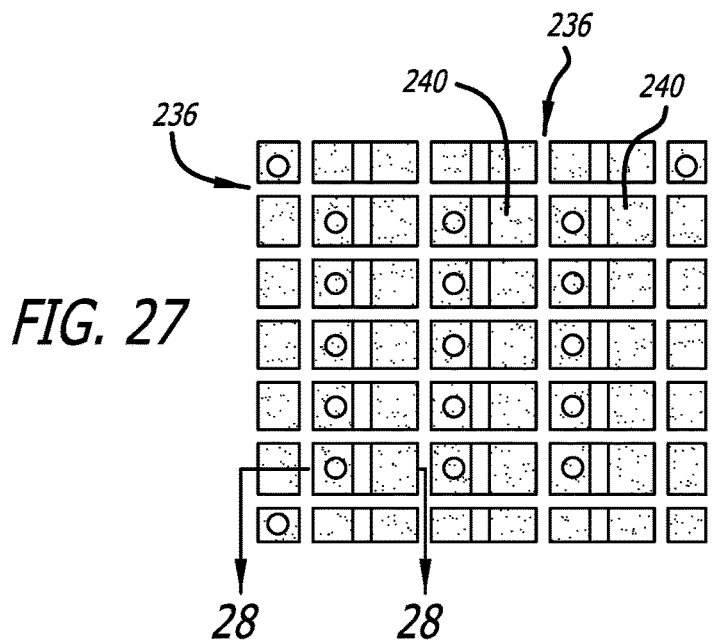

FIG. 27 is a sectional view of the wafer stack 230 of FIG. 26 after it has been cut in the x- and y-directions in order to singulate out the individual devices. The multi-layer PZT microactuator device is now complete.

Figure 28:
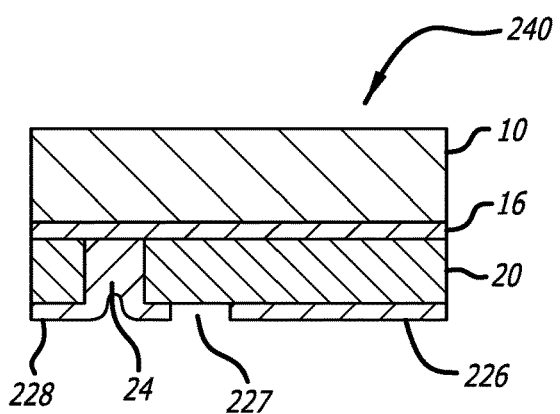

FIG. 28 is a side sectional view of one of the devices shown in FIG. 27 taken along section line 28-28. Gap 227 in the metallization created by masking during the sputtering or other conductive material deposition process, electrically divides the bottom metallization into a second and bottom electrode 226 for the device, and a bottom portion 228 of first electrode 16. Both electrodes 226 and 16/228 are now electrically accessible from the bottom surface of the device 240. Device 240 now acts as a multi-layer PZT device having an inactive restraining layer and a wrap-around electrode, with the via 224 performing the function of a wrap-around electrode but being simpler to manufacture than a wrap-around electrode.

Figure 29:
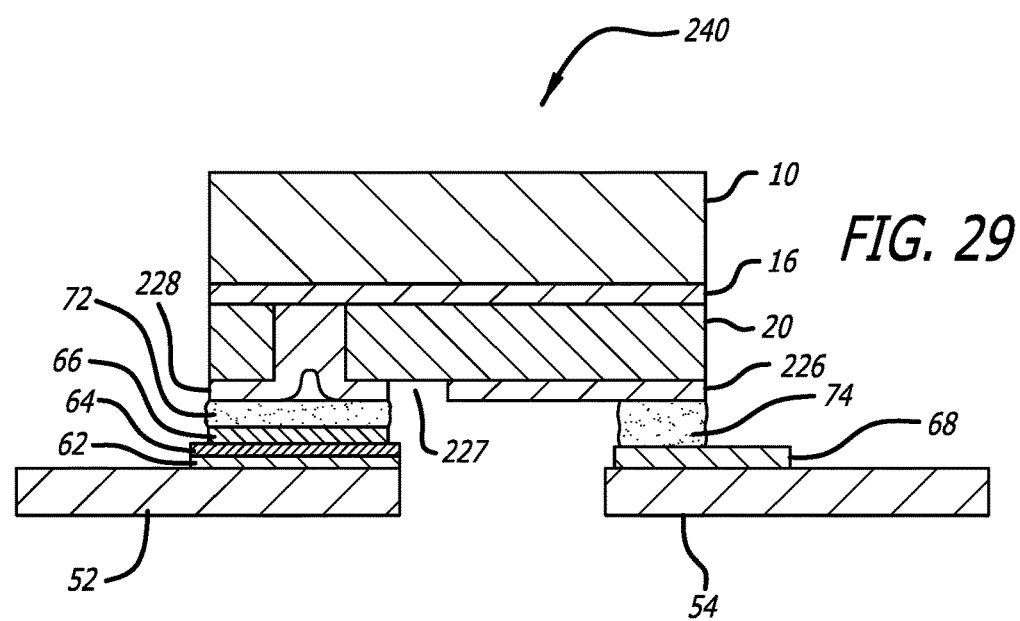

FIG. 29 is a side sectional view the multi-layer piezoelectric actuator device of FIG. 28 adhered into its product environment. The product environment including grounded product portions 52 and 54, the electrical circuit including insulating layer 62 such as polyimide and copper contact pad 66, and conductive adhesive such as conductive epoxy 72 and 74, are essentially the same as in the first illustrative embodiment shown in FIG. 11. This embodiment does not require conductive epoxy to extend into a through-hole in the PZT material in order to complete electrical via 24 from the bottom side of the device to first electrode 16.

According to the process steps disclosed herein, therefore, a number of multi-layer PZT actuators having inactive PZT constraining layers, with both of the electrodes used to activate the device being electrically accessible from the bottom surface of the device, have been constructed at the wafer level of processing. For the third embodiment, the individual devices are all structurally complete upon being singulated from the wafer. For the first and second embodiments, after singulation the only additional structural step required is to complete the via which is performed during the step of bonding the device into its environment, and thus requires no additional device-level processing other than the bonding step which is required anyway. The manufacturing process disclosed herein therefore constitutes an efficient, wafer-level manufacturing process for creating multi-layer PZT actuators, and in particular multi-layer PZT actuators having inactive constraining layers. Such devices can be used for example in hard disk drive suspensions as microactuators, but can be used in other environments as well.

The invention and its use of vias including metallized vias as disclosed herein can be extended to multi-layer PZTs having active layers as well, to make interconnections between various electrode layers within multi-layer PZT device. The vias can thus replace the edge connectors in conventional PZT devices and other devices having wrap-around electrodes. Thus, multi-layer PZT devices having multiple active layers, including one or more active constraining layers, can be constructed using wafer level processing in accordance with the teachings herein.

It will be understood that terms such as "top," "bottom," "above," and "below" as used within the specification and the claims herein are terms of convenience that denote the spatial relationships of parts relative to each other rather than to any specific spatial or gravitational orientation. Thus, the terms are intended to encompass an assembly of component parts regardless of whether the assembly is oriented in the particular orientation shown in the drawings and described in the specification, upside down from that orientation, or any other rotational variation.

It will be appreciated that the term "present invention" as used herein should not be construed to mean that only a single invention having a single essential element or group of elements is presented. Similarly, it will also be appreciated that the term "present invention" encompasses a number of separate innovations which can each be considered separate inventions. Although the present invention has thus been described in detail with regard to the preferred embodiments and drawings thereof, it should be apparent to those skilled in the art that various adaptations and modifications of the present invention may be accomplished without departing from the spirit and the scope of the invention. Accordingly, it is to be understood that the detailed description and the accompanying drawings as set forth hereinabove are not intended to limit the breadth of the present invention, which should be inferred only from the following claims and their appropriately construed legal equivalents.

We claim:

1. A method of manufacturing a multi-layer piezoelectric actuator, the method comprising:
   providing alignment means for aligning first and second wafers of piezoelectric material;
   forming a plurality of through-holes in the second wafer separate from the alignment means;
   forming a first conductive layer on the first wafer, the first conductive layer extending over a plurality of inchoate actuator locations on the first wafer;
   forming a second conductive layer on the second wafer, the second conductive layer extending over a plurality of inchoate actuator locations on the second wafer but does not extend to the through-holes;
   after the first and second conductive layers have been formed, stacking the second layer onto the first layer and adhering the first and second wafers thereto such that the through-holes extend through the second wafer to the first conductive layer on the first wafer, the stacked first and second wafers defining a wafer stack with the first conductive layer being sandwiched between the two piezoelectric layers; and then
   singulating the wafer stack in both x- and y-dimensions to singulate the wafer stack along two dimensions into individual piezoelectric actuators, the individual piezoelectric actuators having first and second piezoelectric actuator layers, the through-holes defining electrical access to electrodes defined by the sandwiched first conductive layer.

2. The method of claim 1 further comprising:
   firing the piezoelectric material to harden the piezoelectric material; and
   poling the piezoelectric actuators.

3. The method of claim 2 wherein the firing and poling steps are performed on the wafer stack before the singulating step, such that the firing and poling steps are performed at a wafer level of manufacturing.

4. The method of claim 1 wherein the first piezoelectric actuator layer has a first electrode on one side thereof defined by the sandwiched first conductive layer, but does not have a second electrode on a second and opposite side thereof, such that the first piezoelectric actuator layer remains substantially piezoelectrically inactive thereby acting as a constraining layer resisting expansion and contraction of the second piezoelectric actuator layer.

5. The method of claim 1 further comprising:
   filling one of said through-holes with conductive adhesive, thereby defining an electrical via of conductive adhesive to the sandwiched first conductive layer.

6. The method of claim 1 wherein the singulating step further comprises:
   dicing through the stacked wafer along lines that are near but not through the through-holes, such that the through-holes remain closed-ended in the x- and y-directions.

7. The method of claim 1 wherein the singulating step further comprises:
   dicing through the stacked wafer along lines that intersect the through-holes such that the through-holes become open-ended in at least one of the x- and y-directions.

8. The method of claim 1 wherein the step of forming a second conductive layer on the second wafer, is performed before stacking the second layer on to the first layer.

9. The method of claim 1 wherein:
   the step of forming the second conductive layer on the second wafer, is performed after the stacking of the second wafer on the first wafer; and
   the method further comprises applying conductive material into the through-holes to define electrical vias through the second wafer, the conductive material in the through-holes comprising a same material as does the second conductive layer, the steps of forming the second conductive layer and applying the conductive material into the through-holes being performed as part of a same processing step carried out at a wafer level of processing.

10. The method of claim 9 wherein the steps of forming the second conductive layer and applying the conductive material into the through-holes comprising sputtering of metal.

* * * * *